(12) United States Patent
Kao et al.

(10) Patent No.: US 9,791,983 B2
(45) Date of Patent: Oct. 17, 2017

(54) CAPACITIVE TOUCH-SENSITIVE DEVICE AND METHOD OF MAKING THE SAME

(71) Applicant: TPK Universal Solutions Limited, Hong Kong (CN)

(72) Inventors: Kuo-Feng Kao, Xinbei (TW); Sung-Chien Huang, Taoyuan (TW); Hung-Yu Tsai, Yilan (TW); Cheng-Yuan Lu, Taoyuan (TW)

(73) Assignee: TPK Universal Solutions Limited, Hong Kong (CN)

( * ) Notice: Subject to any disclaimer, the term of this patent is extended or adjusted under 35 U.S.C. 154(b) by 21 days.

(21) Appl. No.: 14/672,250

(22) Filed: Mar. 30, 2015

(65) Prior Publication Data
US 2015/0277630 A1 Oct. 1, 2015

(30) Foreign Application Priority Data
Mar. 31, 2014 (CN) .......................... 2014 1 0126878

(51) Int. Cl.
*G06F 3/044* (2006.01)
*G06F 3/041* (2006.01)
*H03K 17/96* (2006.01)

(52) U.S. Cl.
CPC ............ *G06F 3/044* (2013.01); *G06F 3/0412* (2013.01); *H03K 17/962* (2013.01); *G06F 2203/04103* (2013.01); *G06F 2203/04111* (2013.01); *H03K 2217/960755* (2013.01)

(58) Field of Classification Search
CPC .......................................... G06F 3/041–3/044
See application file for complete search history.

(56) References Cited

U.S. PATENT DOCUMENTS

| 8,686,271 | B2* | 4/2014 | Wang ................ G06F 17/30861 |
| | | | 700/94 |
| 9,066,426 | B2* | 6/2015 | Zhou .................... H05K 1/0296 |
| 9,195,271 | B2* | 11/2015 | Kang .................... G06F 1/1643 |
| 9,207,720 | B2* | 12/2015 | Kang .................... G06F 1/1643 |
| 9,348,360 | B2* | 5/2016 | Han ........................ G06F 3/044 |
| 2007/0008299 | A1* | 1/2007 | Hristov ................. G06F 3/0416 |
| | | | 345/173 |
| 2010/0026661 | A1* | 2/2010 | Teramoto ................ G06F 3/044 |
| | | | 345/174 |
| 2010/0171718 | A1* | 7/2010 | Denda ..................... G06F 3/044 |
| | | | 345/173 |
| 2010/0233930 | A1* | 9/2010 | Ishida ................... G06F 3/0412 |
| | | | 445/24 |

(Continued)

FOREIGN PATENT DOCUMENTS

| EP | 2592533 | 5/2013 |
| WO | 2013029028 | 2/2013 |
| WO | 2014007333 | 1/2014 |

*Primary Examiner* — Patrick F Marinelli
(74) *Attorney, Agent, or Firm* — Paul Bendemire

(57) ABSTRACT

A capacitive touch-sensitive device includes a transparent substrate unit and at least one patterned transparent electrically-conductive film. The patterned transparent electrically-conductive film is formed on the transparent substrate unit and has a transparent insulating layer and a plurality of mutually and electrically isolated sensor lines that are substantially disposed in the transparent insulating layer. Each of the sensor lines is substantially made of a plurality of non-transparent nano-conductors.

12 Claims, 18 Drawing Sheets

(56) References Cited

U.S. PATENT DOCUMENTS

| | | | | |
|---|---|---|---|---|
| 2011/0254802 A1* | 10/2011 | Philipp | G06F 3/0412 | 345/174 |
| 2011/0256307 A1* | 10/2011 | Kim | G06F 3/044 | 427/79 |
| 2011/0316567 A1* | 12/2011 | Chai | G06F 3/044 | 324/686 |
| 2013/0057503 A1* | 3/2013 | Hristov | G06F 3/044 | 345/174 |
| 2013/0076741 A1* | 3/2013 | Eguchi | G02B 6/005 | 345/419 |
| 2013/0169558 A1* | 7/2013 | Min | G06F 3/044 | 345/173 |
| 2014/0022202 A1* | 1/2014 | Badaye | G06F 3/044 | 345/174 |
| 2014/0035599 A1* | 2/2014 | Shimata | G06F 3/044 | 324/658 |
| 2014/0078111 A1* | 3/2014 | Lee | G06F 3/041 | 345/176 |
| 2014/0118634 A1* | 5/2014 | Kang | G06F 1/1643 | 349/12 |
| 2014/0152910 A1* | 6/2014 | Kang | G06F 1/1643 | 349/12 |
| 2014/0290984 A1* | 10/2014 | Zhou | H05K 1/0296 | 174/251 |
| 2014/0293151 A1* | 10/2014 | He | G06F 3/044 | 349/12 |
| 2014/0320757 A1* | 10/2014 | Hoshtanar | G06F 3/044 | 349/12 |
| 2015/0028894 A1* | 1/2015 | Sleeman | G06F 3/044 | 324/662 |
| 2015/0220183 A1* | 8/2015 | Youngs | G06F 3/044 | 345/173 |
| 2015/0277629 A1* | 10/2015 | Kao | G06F 3/044 | 345/174 |
| 2015/0277630 A1* | 10/2015 | Kao | G06F 3/0412 | 345/174 |
| 2016/0034071 A1* | 2/2016 | Jee | G06F 3/044 | 345/174 |
| 2016/0188100 A1* | 6/2016 | Teranishi | G06F 3/044 | 345/174 |
| 2016/0209954 A1* | 7/2016 | Cho | G06F 3/044 | |

\* cited by examiner

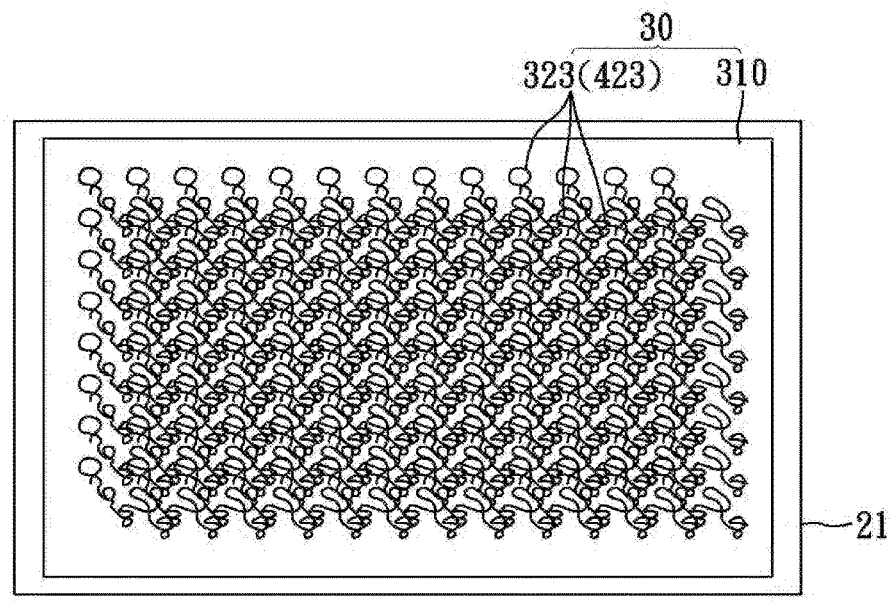
F I G. 10
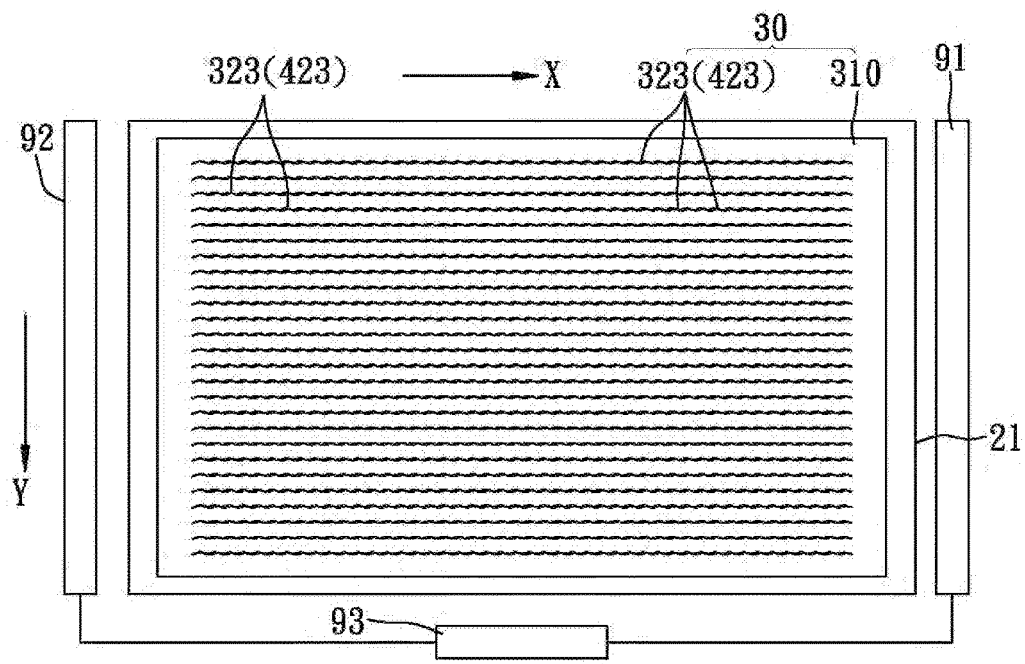
F I G. 11

CAPACITIVE TOUCH-SENSITIVE DEVICE AND METHOD OF MAKING THE SAME

This application claims priority to Chinese Application Serial Number 201410126878.X, filed on Mar. 31, 2014, which is herein incorporated by reference.

BACKGROUND OF THE INVENTION

Field of the Invention

The disclosure relates to a touch-sensitive device, more particularly to a capacitive touch-sensitive device and a method for making the same.

Related Art of Invention

Recently, with the development of touch-sensitive technology, touch-sensitive devices are widely adopted in various electronic products, such as mobile phones, personal digital assistants (PDAs), input interface of gaming devices, and touch panels. In practice, the touch-sensitive device is usually combined with a flat panel display (FPD) to form a touch panel to be mounted on various electronic products. A user may input data and instructions through the touch panel instead of conventional input devices such as keyboards and mouses, thereby bringing great convenience to the user.

Normally, a transparent electrically-conductive substrate of the capacitive touch-sensitive device is mainly constituted by a transparent substrate and a patterned transparent electrically-conductive layer. The method for making the aforesaid transparent electrically-conductive substrate is mainly to coating a transparent electrically-conductive layer, which is usually made of transparent metal oxide, such as indium tin oxide (ITO) and the like, onto the non-conductive transparent substrate. Thereafter, the transparent electrically-conductive layer is further subjected to photolithography process and etching to form a transparent electrically-conductive layer which has a predetermined pattern (e.g., to form an electrode pattern of multiple rows or intersecting rows and columns) and serves as the sensor electrode layer of the capacitive touch-sensitive device. The aforesaid electrode pattern includes an ITO zone (i.e., the electrode zone), and an etched zone, on which no ITO conductive layer is formed so that light can be directly transmitted to the transparent substrate. However, since these two zones have different refractive indexes, the user may clearly observe etched lines formed at the junctions between the two, which may seriously and adversely affect the visual appearance of the touch panel.

To solve the above-mentioned problem, skilled artisans in the field tend to adopt index matching (IM) membrane layers. Referring to FIG. 1, a method to reduce significance of brightness of etched lines of a patterned ITO layer mainly includes: depositing an IM membrane layer 12 onto a polyethylene terephthalate (PET) layer 11; depositing an ITO layer 13 onto the IM layer 12; and lastly, patterning the ITO layer 13 to form a patterned ITO layer 14, where the IM membrane layer 12 is usually constituted by a plurality of high refractive index dielectric layers (such as $Nb_2O_5$), and a plurality of low refractive index dielectric layers (such as $SiO_2$) alternately stacked with the high refractive index dielectric layers. Although such IM membrane layer 12 may reduce the brightness of the etched lines of the patterned ITO layer, the thickness of the IM membrane layer 12 is comparatively large, resulting in relatively high production cost and a time-consuming manufacturing process. Moreover, the IM membrane layer 12 may be an obstacle with respect to thinning of the touch panel.

From the description above, to lower the brightness of the etched lines of a patterned transparent conductive layer for improving displaying effect of a touch panel and to simultaneously reduce the production cost of and thinning of a capacitive touch-sensitive device have become tasks for the skilled artisan.

SUMMARY OF THE INVENTION

Therefore, one object of the disclosure is to provide a capacitive touch-sensitive device.

Another object of the disclosure is to provide a method for making a capacitive touch-sensing device.

According to the disclosure, a capacitive touch-sensitive device may include a transparent substrate unit and at least one patterned transparent electrically-conductive film. The patterned transparent electrically-conductive film is formed on the transparent substrate unit, and has a transparent insulating layer and a plurality of mutually electrically isolated sensor lines that are substantially disposed in the transparent insulating layer. Each of the sensor lines is substantially made of a plurality of non-transparent nano-conductors.

According to the disclosure, a method for making the capacitive touch-sensitive device may include:

applying at least one transparent paste layer onto a transparent substrate unit, the transparent paste layer having a plurality of non-transparent nano-conductors;

defining a plurality of to-be-etched zones that are mutually spaced apart;

curing the transparent paste layer to form at least one transparent insulating layer; and etching physically or chemically the to-be-etched zones to remove the non-transparent nano-conductors in the to-be-etched zones, such that the non-transparent nano-conductors remained in the transparent insulating layer are defined into a plurality of sensor lines, so as to form at least one patterned transparent electrically-conductive film.

BRIEF DESCRIPTION OF THE DRAWINGS

Other features and advantages of the disclosure will become apparent in the following detailed description of the exemplary embodiments with reference to the accompanying drawings, of which:

FIG. 10 is a top schematic view of the second exemplary embodiment, illustrating a Step (a) of a method for making the capacitive touch-sensitive device of the second exemplary embodiment;

FIG. 11 is a top schematic view of the second exemplary embodiment, illustrating a Step (b) of the method;

DETAILED DESCRIPTION OF THE INVENTION

Figure 1:
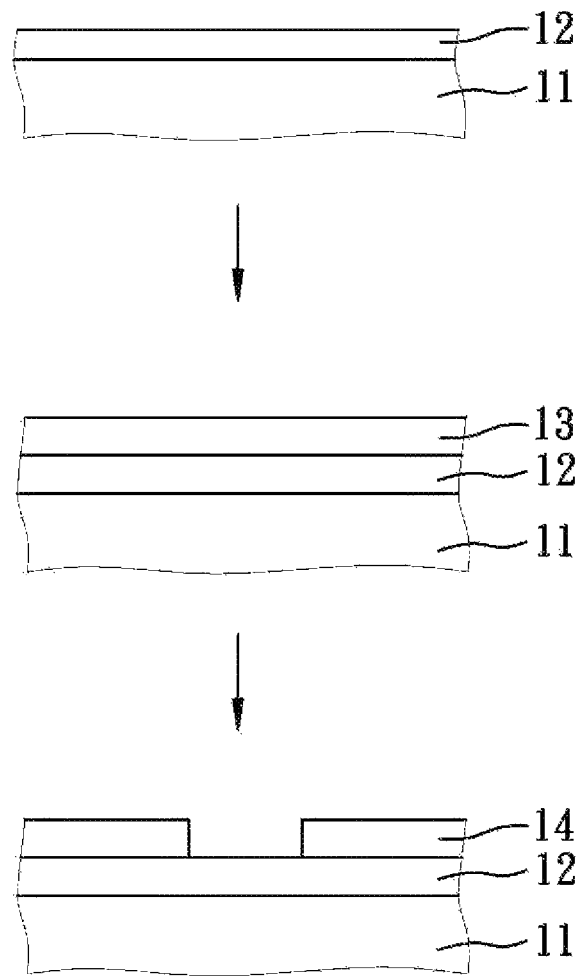
FIG. 1 is a schematic flow chart illustrating a conventional method to lower brightness of contour lines of a patterned ITO layer.

Before the disclosure is described in greater detail, it should be noted that like elements are denoted by the same reference numerals throughout the disclosure.

Figure 2:
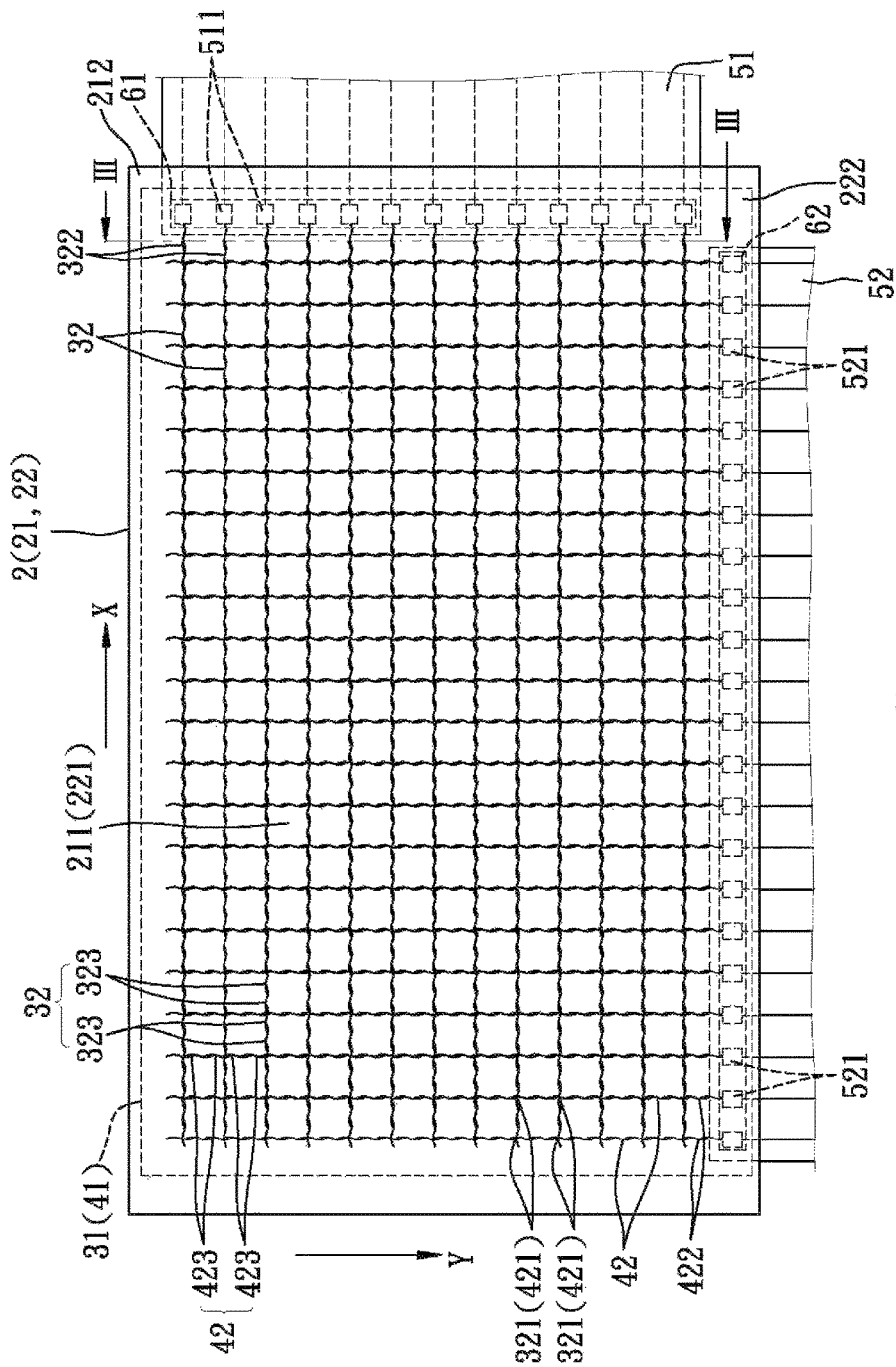
FIG. 2 is a fragmentary top schematic view of a first exemplary embodiment of a capacitive touch-sensitive device according to the present disclosure.
Figure 3:
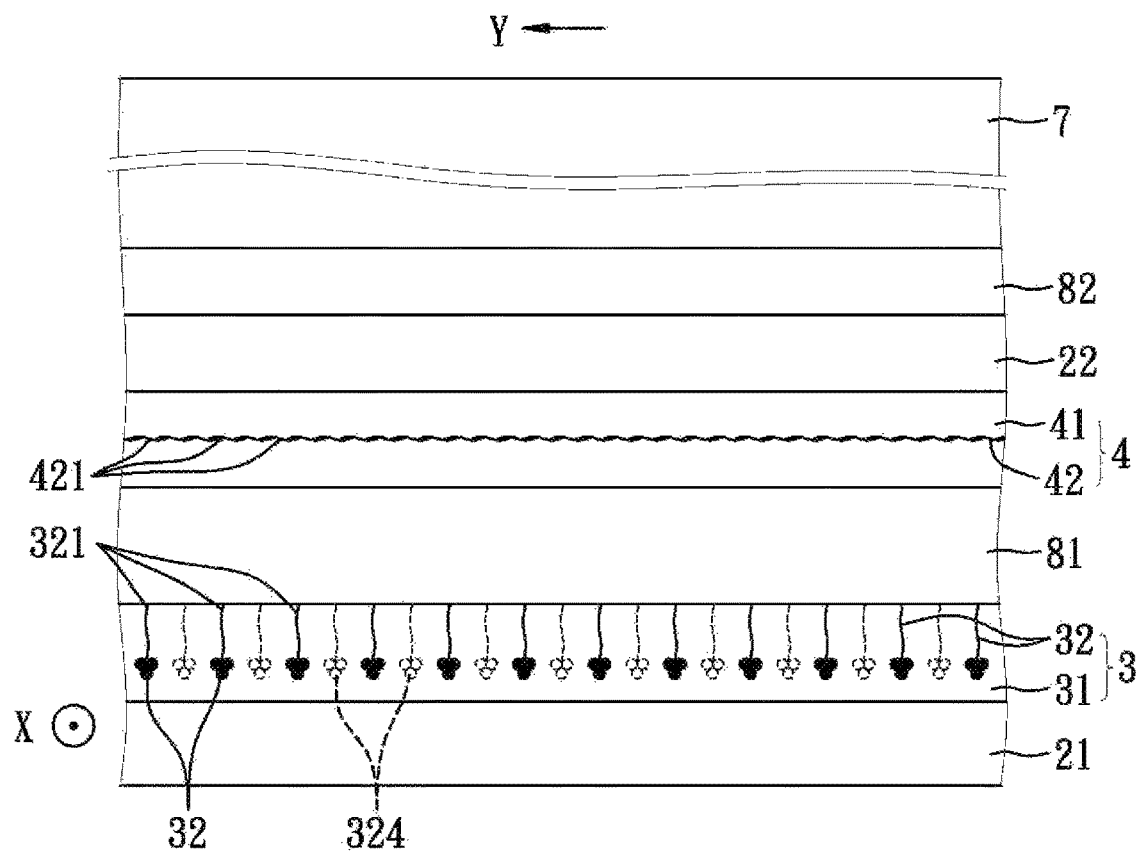
FIG. 3 is a fragmentary schematic sectional view of the first exemplary embodiment taken along line in FIG. 2.

Referring to FIGS. 2 and 3, the first exemplary embodiment of a capacitive touch-sensitive device according to the present disclosure includes a transparent substrate unit 2, a lower patterned transparent electrically-conductive film 3, an upper patterned transparent electrically-conductive film 4, a lower flexible printed circuit (FPC) board 51, an upper flexible printed circuit board 52, a lower anisotropic electrically-conductive film 61, an upper anisotropic electrically-conductive film 62, a transparent protective cover 7, a lower optical clear adhesive layer (OCA) 81 and an upper optical clear adhesive layer 82. Simply put, the capacitive touch-sensitive device of the first exemplary embodiment is a double layered structure.

The transparent substrate unit 2 includes a lower transparent substrate 21 and an upper transparent substrate 22 that are disposed to face each other. Each of the lower and upper transparent substrates 21, 22 has a viewable zone 211, 221 and a trace zone 212, 222 adjacent to the viewable zone 211, 221.

The lower patterned transparent electrically-conductive film 3 has a lower transparent insulating layer 31 formed on the lower transparent substrate 21, and a plurality of mutually electrically isolated first sensor lines 32 disposed in the lower transparent insulating layer 31. The upper patterned transparent electrically-conductive film 4 has an upper transparent insulating layer 41 formed on the upper transparent substrate 22, and a plurality of mutually electrically isolated second sensor lines 42 disposed in the upper transparent insulating layer 41. Each of the first and second sensor lines 32, 42 has a plurality of mutually spaced apart sensing segments 321, 421, and an outer terminal portion 322, 422. Each of the first or second sensor lines 32, 42 is made of non-transparent nano-conductors 323 (or 423) that contact each other and that are arranged along a line direction of the first (or) second sensor lines 323 (or 423).

In this embodiment, the line direction of the first sensor lines 32 is a first direction (X), and the sensing segments 321 and the outer terminal portions 322 of the first sensor lines 32 are located in the lower transparent insulating layer 31, where the sensing segments 321 of the first sensor lines 32 are disposed at the viewable zone 211 of the lower transparent substrate 21, and the outer terminal portions 322 are disposed at the trace zone 212 of the lower transparent substrate 21. The first sensor lines 32 are arranged to be mutually spaced apart in a second direction (Y) substantially perpendicular to the first direction (X). The line direction of the second sensor lines 42 is the second direction (Y), and the second sensor lines 42 are arranged to be mutually spaced apart in the first direction (X). The sensing segments 421 and the outer terminal portions 422 of the second sensor lines 42 are located in the upper transparent insulating layer 41, where the sensing segments 421 of the second sensor lines 42 are disposed at the viewable zone 221 of the upper transparent substrate 22, and the outer terminal portions 422 of the second sensor lines 42 are disposed at the trace zone 222 of the upper transparent substrate 22. The sensing segments 421 of the second sensor lines 42 are disposed correspondingly above and across the sensing segments 321 of the first sensor lines 32.

The lower flexible circuit board 51 has a plurality of mutually electrically isolated bonding pads 511 bonded respectively to the outer terminal portions 322 of the first sensor lines 32 of the lower patterned transparent electrically-conductive film 3 via the lower anisotropic electrically-conductive film 61. The upper flexible circuit board 52 has a plurality of mutually electrically isolated bonding pads 521 bonded respectively to the outer terminal portions 422 of the second sensor lines 42 of the upper patterned transparent electrically-conductive film 4 via the upper anisotropic electrically-conductive film 62. The transparent protective cover 7 covers the lower and upper patterned transparent electrically-conductive layers 3, 4. The lower optical clear adhesive layer 81 is attached to and between the lower transparent insulating layer 31 and the upper transparent insulating layer 41, and the upper optical clear adhesive layer 82 is attached to and between the transparent protective cover 7 and the upper transparent substrate 22.

The shape of the non-transparent nano-conductors 323, 423 may be configured as spheres, wires, or discs. In this embodiment, the non-transparent nano-conductors 323, 423 are silver nano-wires, and the lower and upper transparent insulating layers 31, 41 are made of a polymeric material (e.g., transparent resin). The first sensor lines 32 and the second sensor lines 42 of this embodiment are correspondingly disposed in the lower and upper transparent insulating layers 31, 41 which have substantially identical refractive indexes. In addition, the first sensor lines 32 and the second sensor lines 42 are mutually electrically isolated via the lower and upper transparent insulating layers 31, 41, correspondingly. As such, when the capacitive touch-sensitive device of the first exemplary embodiment is incorporated with a flat panel display to become a touch panel, light emitted from a light source of the front panel display and into the lower and upper patterned transparent electrically-conductive films 3, 4 may not incur bright etched lines at pattern boundaries of the lower and upper patterned transparent electrically-conductive films 3, 4, so that the displaying effect of the touch panel can be effectively enhanced.

A method for making the capacitive touch-sensitive device of the first exemplary embodiment is illustrated herein below with reference to FIGS. 4 to 7, as well as FIGS. 2 and 3.

Figure 4:
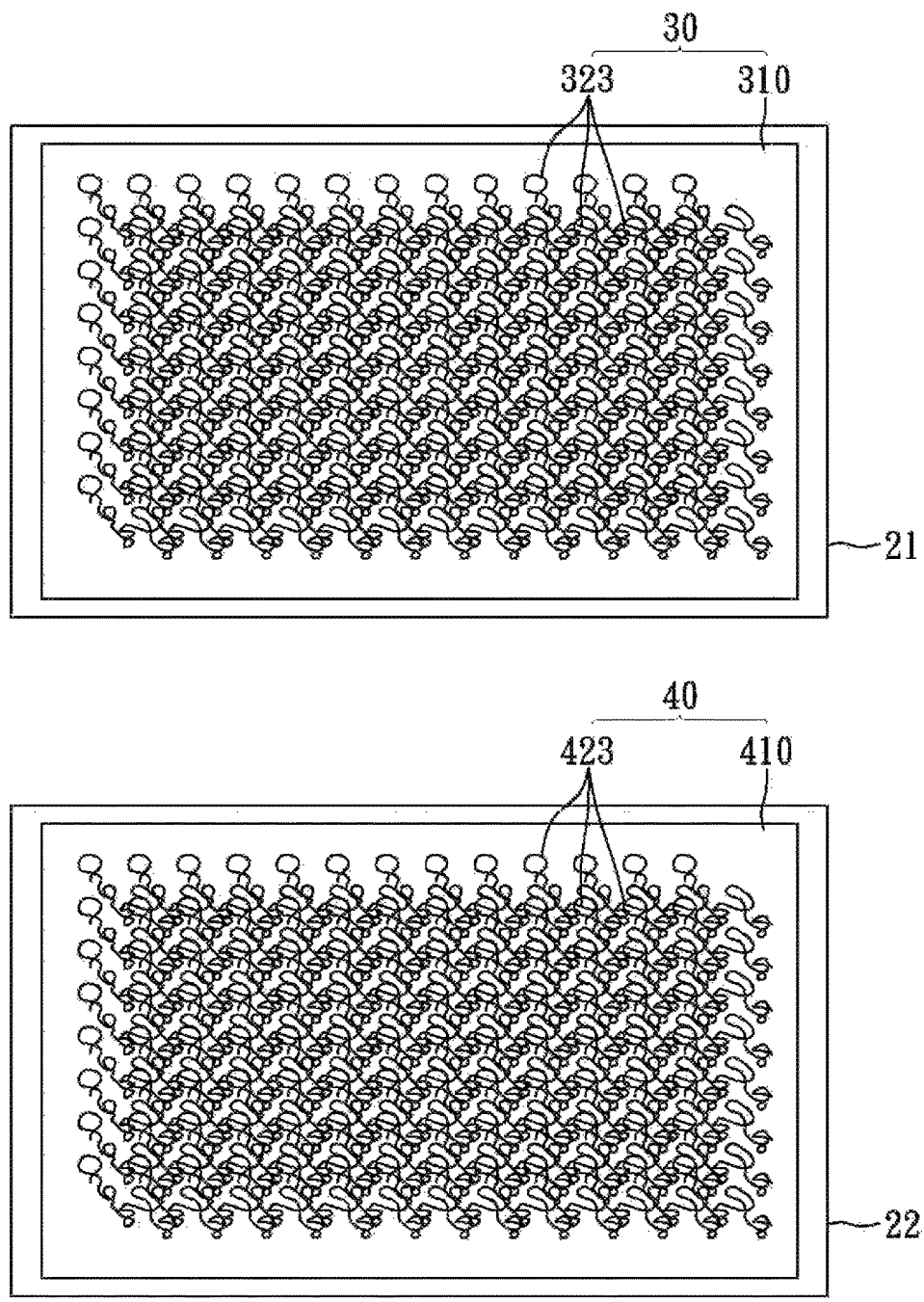
FIG. 4 is a top schematic view of the first exemplary embodiment, illustrating a Step (A) of a method for making the capacitive touch-sensitive device of the first exemplary embodiment.

As shown in FIG. 4, Step (A) is to form transparent electrically-conductive paste layers 30, 40, including applying a lower transparent paste layer 310 onto the lower transparent substrate 21 and applying an upper transparent paste layer 410 onto the upper transparent substrate 22. The lower and upper transparent paste layers 310, 410 contain the non-transparent nano-conductors 323, 423. In this embodiment, each of the lower and upper transparent paste layers 310, 410 is a layer of polymeric adhesives.

Figure 5:
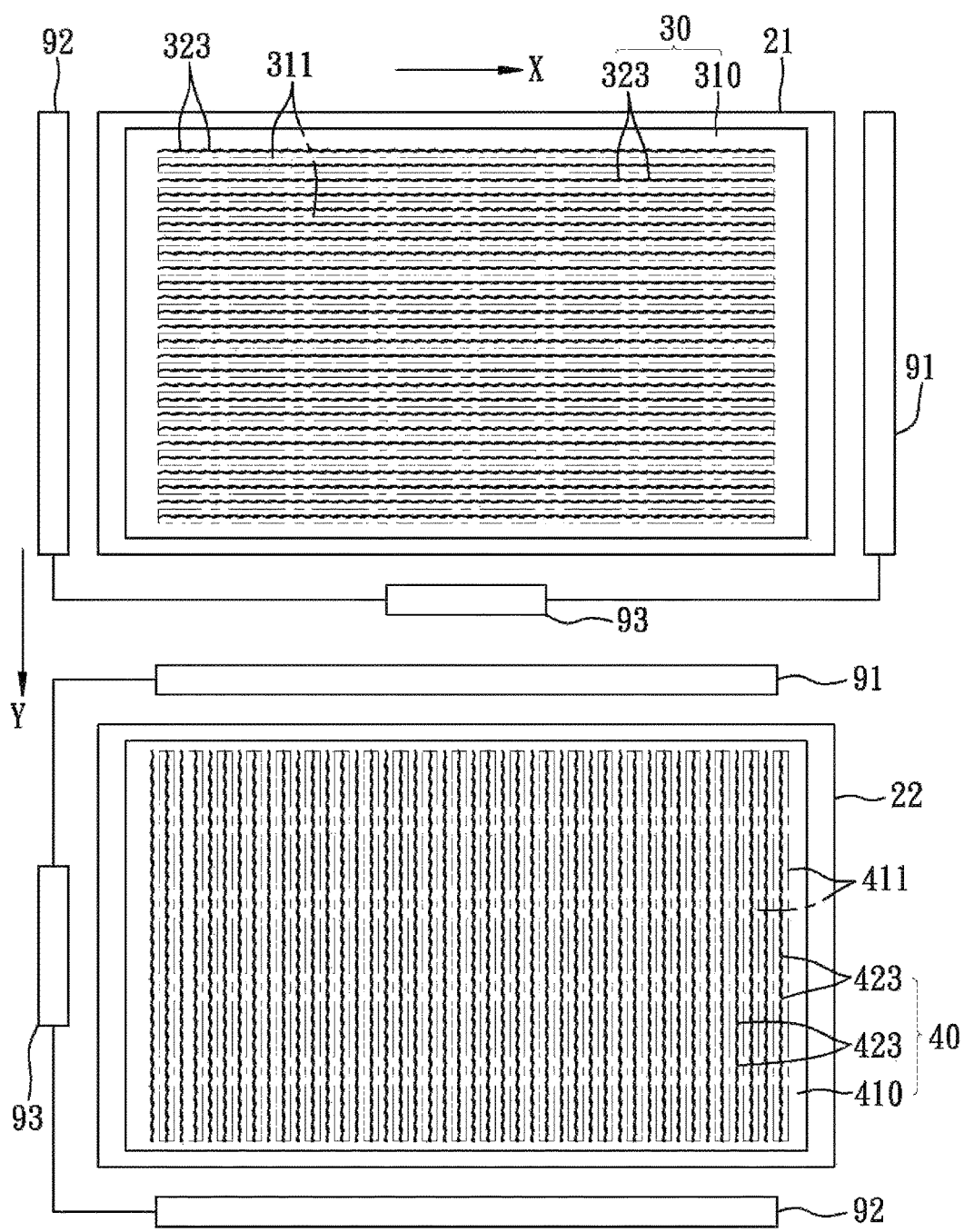
FIG. 5 is a top schematic view of the first exemplary embodiment, illustrating Steps (B) and (C) of the method.

As shown in FIG. 5, Step (B) is to provide an electric or magnetic field to the lower and upper transparent electrically-conductive paste layers 30, 40 to arrange the non-transparent nano-conductors 323, 423 in the lower and upper transparent paste layers 310, 410, such that the non-transparent nano-conductors 323, 423 of each of the first and second sensor lines 32, 42 contact each other and are arranged along the line directions of the first and second sensor lines 32, 42. Preferably, each of the lower and upper transparent paste layers 310, 410 has a predetermined thickness. Step (A) is conducted by providing an electric field utilizing a pair of electrode plates 91, 92 to the lower and upper transparent electrically-conductive paste layers 30, 40. The predetermined thickness of each of the lower and upper transparent paste layers 310, 410 is sufficient to partially expose the non-transparent nano-conductors 323, 423 therefrom. In this embodiment, the predetermined thickness of the lower and upper transparent paste layers 310, 410 is about 100 nm. In addition, the non-transparent nano-conductors 323 in the lower transparent paste layer 310 contact each other and are arranged along the first direction (X), and the non-transparent nano-conductors 423 in the upper transparent paste layer 410 contact each other and arranged in the second direction (Y). It is worth noting that, although in microscopic view the non-transparent nano-conductors 323, 423 are tangled with each other, Step (B) may be conducted to arrange the non-transparent nano-conductors 323, 423 to be in contact with each other correspondingly along the first direction (X) and the second direction (Y), so that the conductivity of the first and second sensor lines 32, 42 can be assured and that electrical stability of the capacitive touch-sensitive device can be improved according to the present disclosure.

Referring to FIG. 5 again, Step (C) is to define to-be-etch zones 311, 411, including defining the lower transparent paste layer 310 to have a plurality of first to-be-etch zones 311 extending along the first direction (X), and defining the upper transparent paste layer 410 to have a plurality of second to-be-etch zones 411 extending along the second direction (Y). The first to-be-etched zones 311 are mutually spaced apart in the second direction (Y), and the second to-be-etched zones 411 are mutually spaced apart in the first direction (X).

Figure 6:
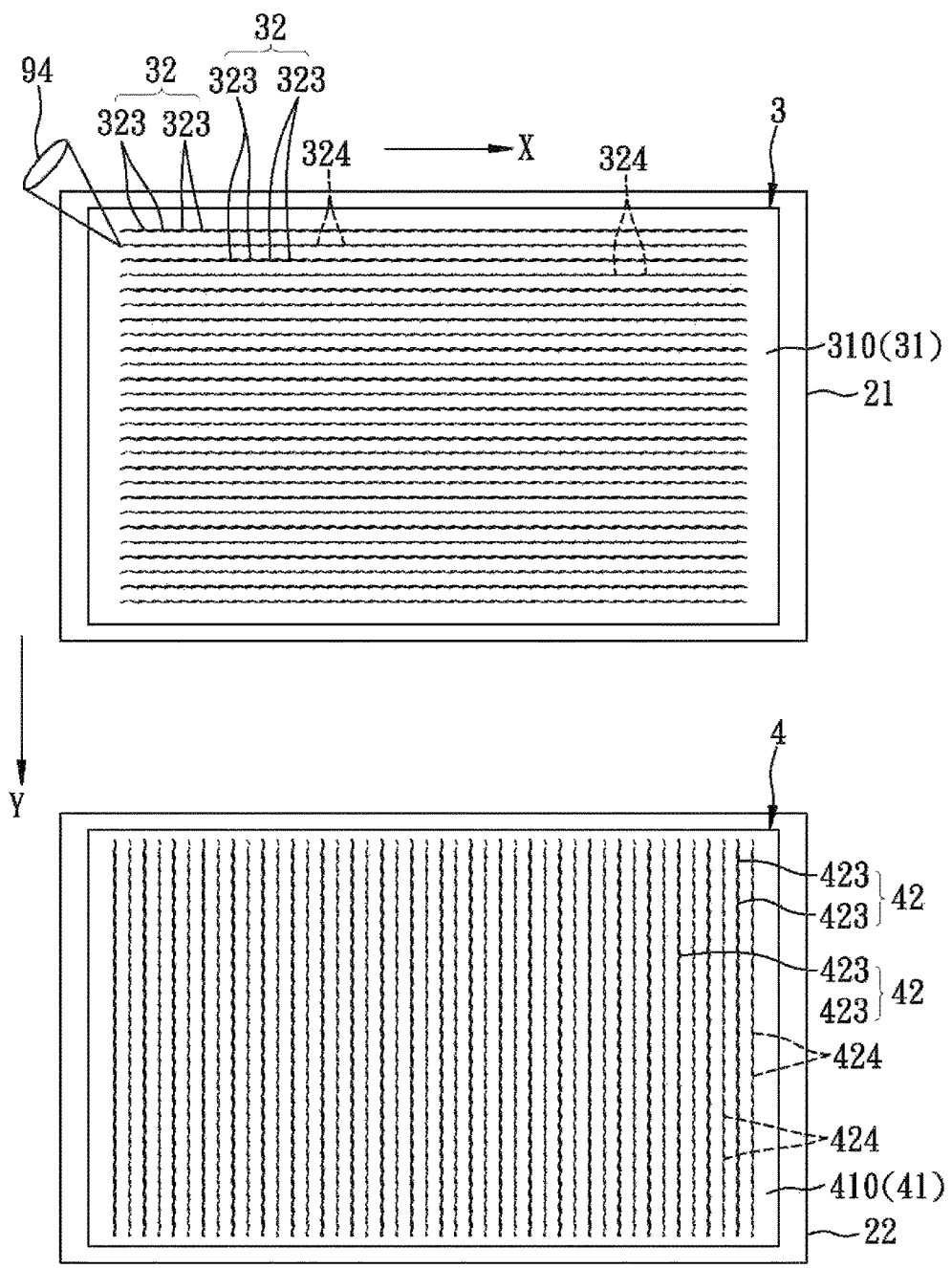
FIG. 6 is a top schematic view of the first exemplary embodiment, illustrating Steps (D) and (E) of the method.

Referring to FIG. 6, Step (D) is to cure the lower and upper transparent paste layers 310, 410 to respectively form the lower and upper transparent insulating layers 31, 41.

Referring to FIG. 6 again, Step (E) is to etch physically or chemically the first and second to-be-etched zones 311, 411, so as to remove the non-transparent nano-conductors 323, 423 from the first and second to-be-etched zones 311, 411. The non-transparent nano-conductors 323, 423 remained in the lower and the upper transparent insulating layers 31, 41 are thus defined correspondingly into the first sensor lines 32, which extend along the first direction (X), and the second sensor lines 42, which extend along the second direction (Y), thereby forming the lower and upper patterned transparent electrically-conductive films 3, 4. Suitable physical and chemical etching methods for the first exemplary embodiment according to the present disclosure may be laser ablation and selective wet-etching. In this embodiment, Step (E) is conducted using a laser device 94 to burn off/gasify the non-transparent nano-conductors 323, 423 that are in the first and second to-be-etched zones 311, 411 and are partially exposed from the lower and upper transparent insulating layers 31, 41. The first and second to-be-etched zones 311, 411 are thus formed with a plurality of nano-scale channels 324, 424, such that the gasified non-transparent nano-conductors 323, 423 leave the lower and upper transparent insulating layers 31, 41 from such channels 324, 424. Preferably, the laser used in Step (E) has a power ranging from 5 W to 8 W with a wavelength of 1064 nm. It should be noted that although the nano-scale channels 324, 424 are formed, the appearance thereof may not be adversely affected since in macroscopic scale they are not discernible for human eyes. It is worth to further note that the nano-scale channels 324, 424 in the lower and upper transparent insulating layers 31, 41 may form rough interfaces therein to effectively provide scattering of the light source.

Figure 7:
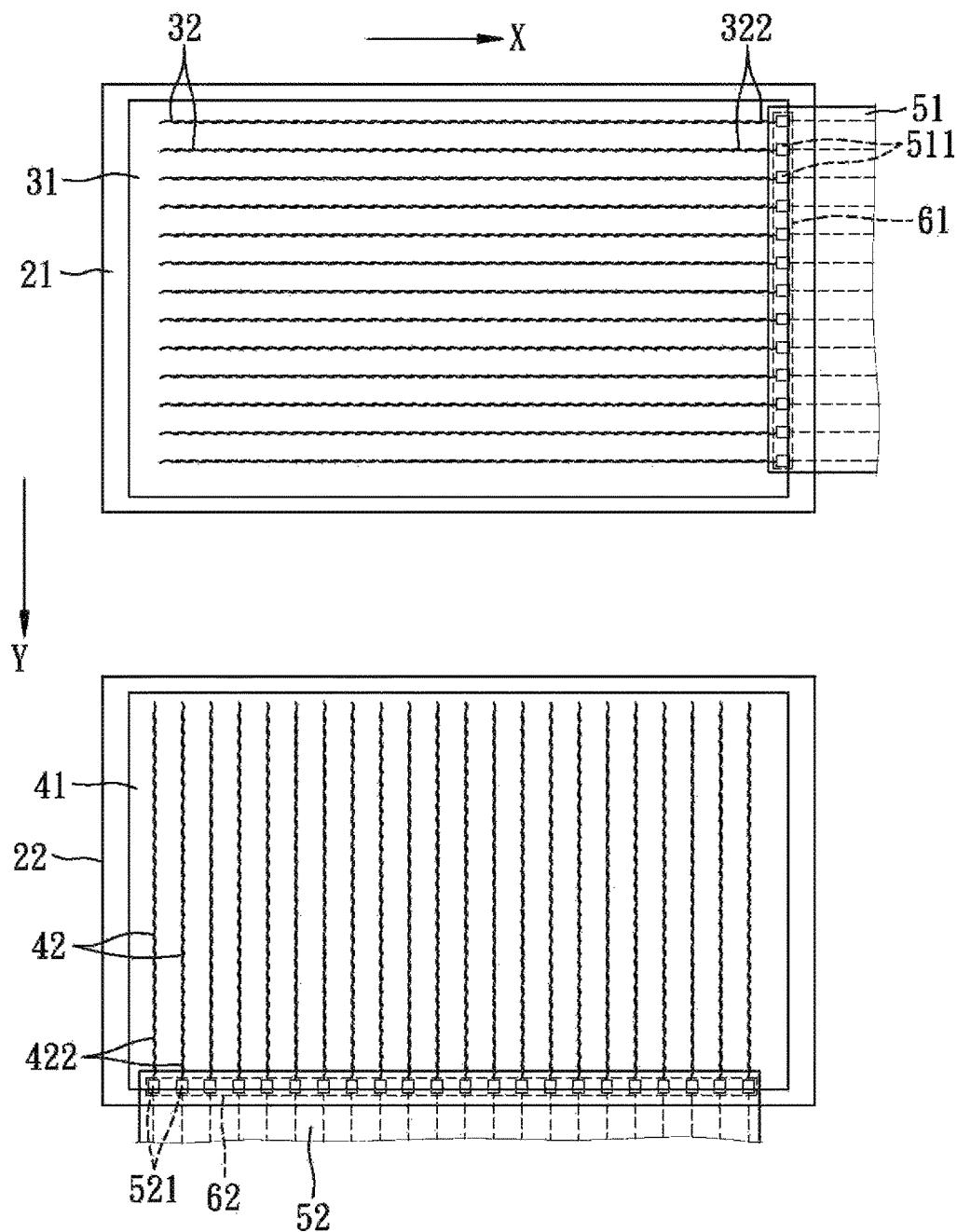
FIG. 7 is a fragmentary top schematic view of the first exemplary embodiment, illustrating a Step (F) of the method.

Referring to FIG. 7, Step (F) is to connect external circuits, including bonding the outer terminal portions 322 of the first sensor lines 32 in the lower transparent insulating layer 31 to the bonding pads 511 of the lower flexible printed circuit board 51 using the lower anisotropic electrically-conductive film 61, and bonding the outer terminal portions 422 of the second sensor lines 42 in the upper transparent insulating layer 41 to the bonding pads 521 of the upper flexible printed circuit board 52 using the upper anisotropic electrically-conductive film 62.

Referring to FIG. 3, Step (G) is a packaging step, including attaching the lower optical clear adhesive layer 81 onto and between the lower and upper transparent insulating layers 31, 41, and attaching the upper optical clear adhesive layer 82 onto the upper transparent substrate 22 and the transparent protective cover 7.

Figure 8:
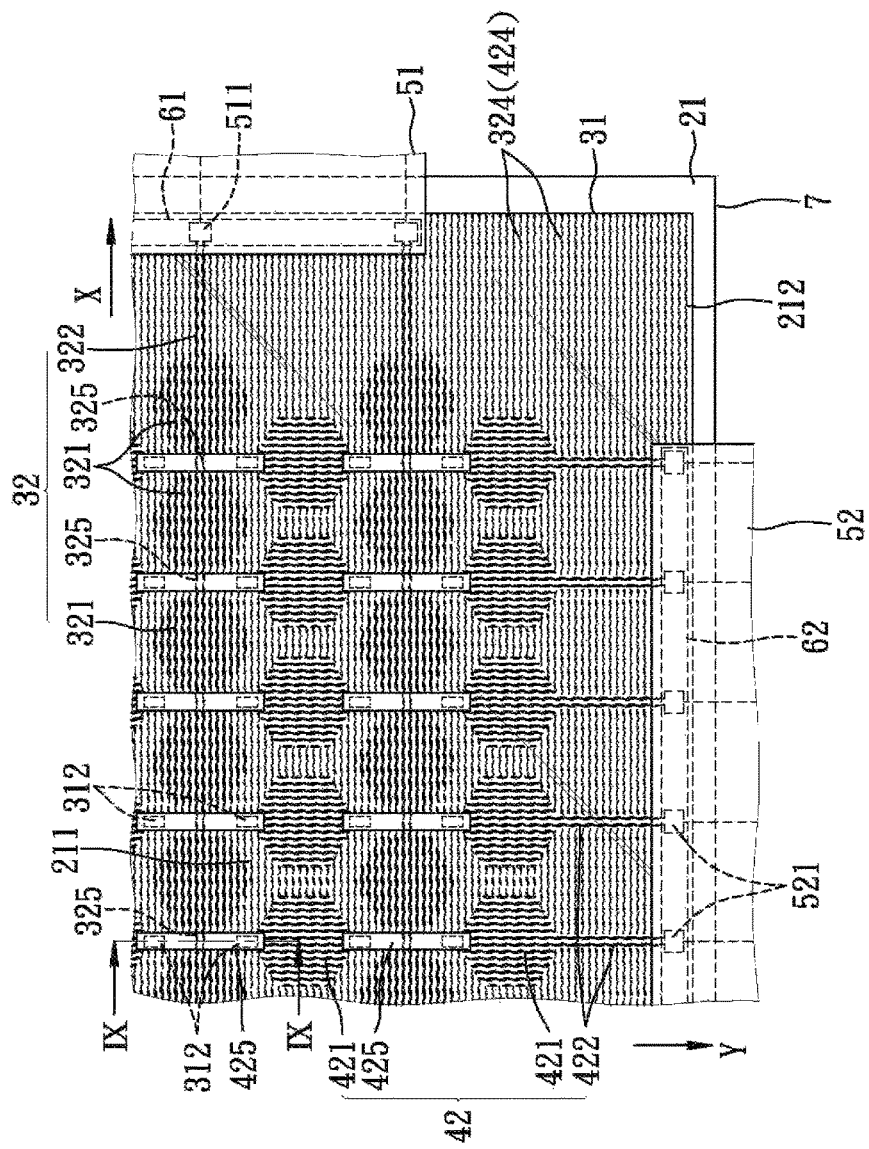
FIG. 8 is a fragmentary top schematic view of a second exemplary embodiment of the capacitive touch-sensitive device according to the present disclosure.
Figure 9:
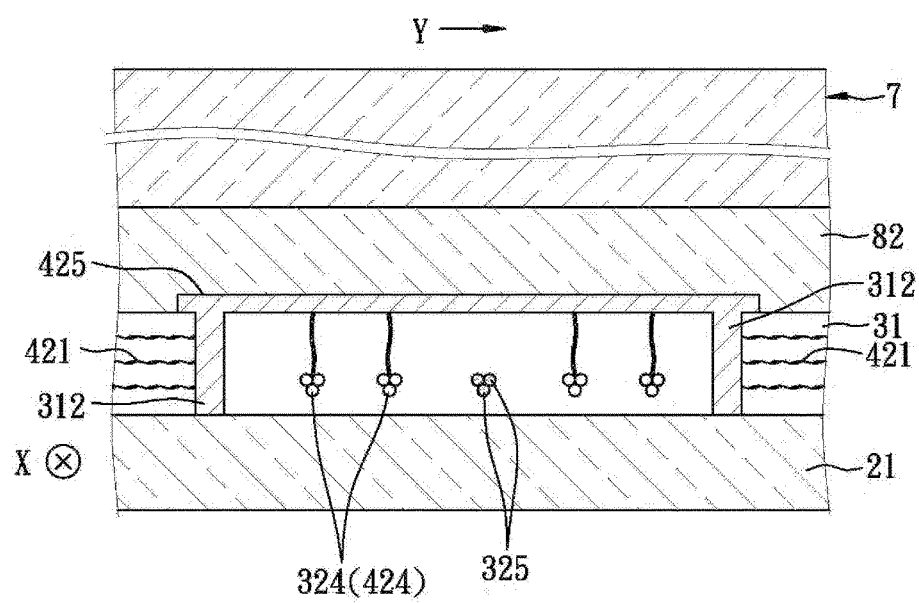
FIG. 9 is a fragmentary schematic sectional view of the second exemplary embodiment taken along line IX-IX in FIG. 8.

Referring to FIGS. 8 and 9, a second exemplary embodiment of the capacitive touch-sensitive device according to the present disclosure is shown to be similar to that of the first exemplary embodiment. The difference resides in that the capacitive touch-sensitive device of the second exemplary embodiment only includes the lower patterned transparent electrically-conductive film 3 and omits the lower optical clear adhesive layer 81. In addition, the transparent substrate unit 2 of the second exemplary embodiment only includes the lower transparent substrate 21, and the detail structure of the lower patterned transparent electrically-conductive film 3 is different from the first exemplary embodiment. Simply put, the capacitive touch-sensitive device of the second exemplary embodiment is a single layer structure.

In greater detail, the lower patterned transparent electrically-conductive film 3 has the lower transparent insulating layer 31 formed on the lower transparent substrate 21, and the first and second sensor lines 32, 42 substantially disposed in the lower transparent insulating layer 31 and mutually electrically isolated. The lower transparent insulating layer 31 is formed with multiple pairs of holes 312. Each of the first sensor lines 32 further has a plurality of connecting segments 325 interconnecting adjacent pairs of the sensing segments 321, and each of the second sensor lines 42 further has a plurality of connecting segments 425 interconnecting adjacent pairs of the sensing segments 421.

The line direction of the first sensor lines 32 is the first direction (X), so that the sensing segments 321 and the outer terminal portions 322 of the first sensor lines 32 are located in the lower transparent insulating layer 31 and are disposed correspondingly in the viewable zone 211 and the trace zone 212 of the lower transparent substrate 21. The first sensor lines 32 are mutually spaced apart along the second direction (Y). The line direction of the second sensor lines 42 is the second direction (Y), and the second sensor lines 42 are mutually spaced apart in the first direction (X), so that the sensing segments 421 and the outer terminal portions 422 of the second sensor lines 42 are located in the lower transparent insulating layer 31 and are correspondingly disposed at the viewable zone 211 and the trace zone 212 of the lower transparent substrate 21. For the lower transparent insulating layer 31, the holes 312 of each pair are disposed oppositely between a corresponding adjacent pair of the sensing segments 421 of the second sensor lines 42 along the second direction (Y). Each of the connecting segments 425 of the second sensor lines 42 are formed on the lower transparent insulating layer 31 to fill a corresponding pair of the holes 312 and to bridge the corresponding adjacent pair of the sensing segments 421. The connecting segments 425 of the second sensor lines 42 are disposed respectively above and across the connecting segments 325 of the first sensor lines 32. The upper optical clear adhesive layer 82 is attached to and between the lower transparent insulating layer 31 and the transparent protective cover 7.

The method for making the capacitive touch-sensitive device of the second exemplary embodiment according to the present disclosure is described herein below with reference to FIGS. 10 to 18, as well as FIGS. 8 and 9.

As shown in FIG. 10, Step (a) is to form a lower transparent electrically-conductive paste layer 30, including applying a lower transparent paste layer 310, which contains the non-transparent nano-conductors 323, 423, onto the lower transparent substrate 21.

As shown in FIG. 11, Step (b) includes providing an electric field to the lower transparent electrically-conductive past layer 30 using the electrode plates 91, 92 electrically coupled with the power supply 93, such that the non-transparent nano-conductors 323, 423 in the lower transparent paste layer 310 are arranged into multiple rows along the first direction (X), in which the non-transparent nano-conductors 323, 423 contact each other.

Figure 12:
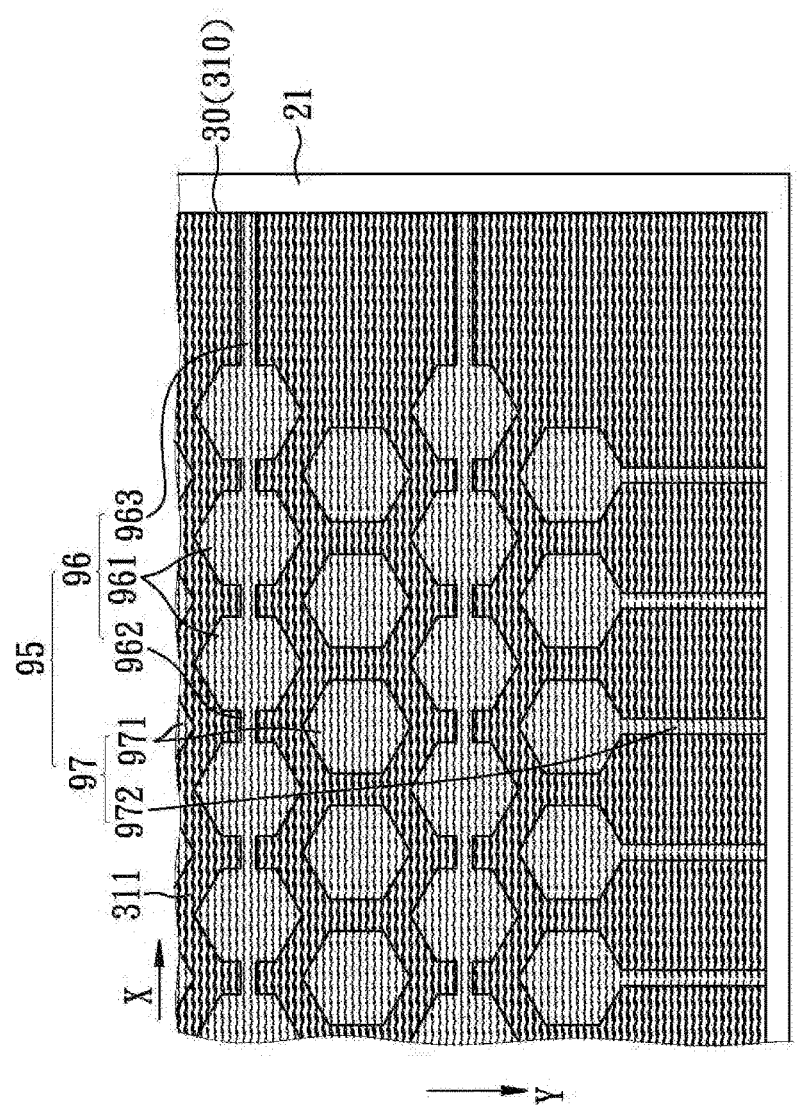
FIG. 12 is a fragmentary top schematic view of the second exemplary embodiment, illustrating a Step (c) of the method.

Referring to FIG. 12, Step (c) is to define to-be-etched zones 311, including forming a mask layer 95 onto the lower transparent electrically-conductive paste layer 30, so as to define the first to-be-etched zones 311 at portions of the lower transparent paste layer 310 that are exposed from the mask layer 95. The mask layer 95 has a plurality of first line patterns 96 extending along the first direction (X) and being mutually spaced apart in the second direction (Y), and a plurality of second line patterns 97. Each of the first line patterns 96 has a plurality of sensing segments 961, a plurality of connecting segments 962 interconnecting adjacent pairs of the sensing segments 961, and an outer terminal portion 963 connected to an outermost one of the sensing segments 961. Each of the second line patterns 97 has a plurality of sensing segments 971 arranged along the second direction (Y) and mutually spaced apart in the first direction (X), and an outer terminal portion 972 connected to an outermost one of the sensing segments 971 and extending along the second direction (Y). The sensing segments 971 of each of the second line patterns 97 are disposed between the connecting segments 962 of an adjacent pair of the first line patterns 96.

Figure 13:
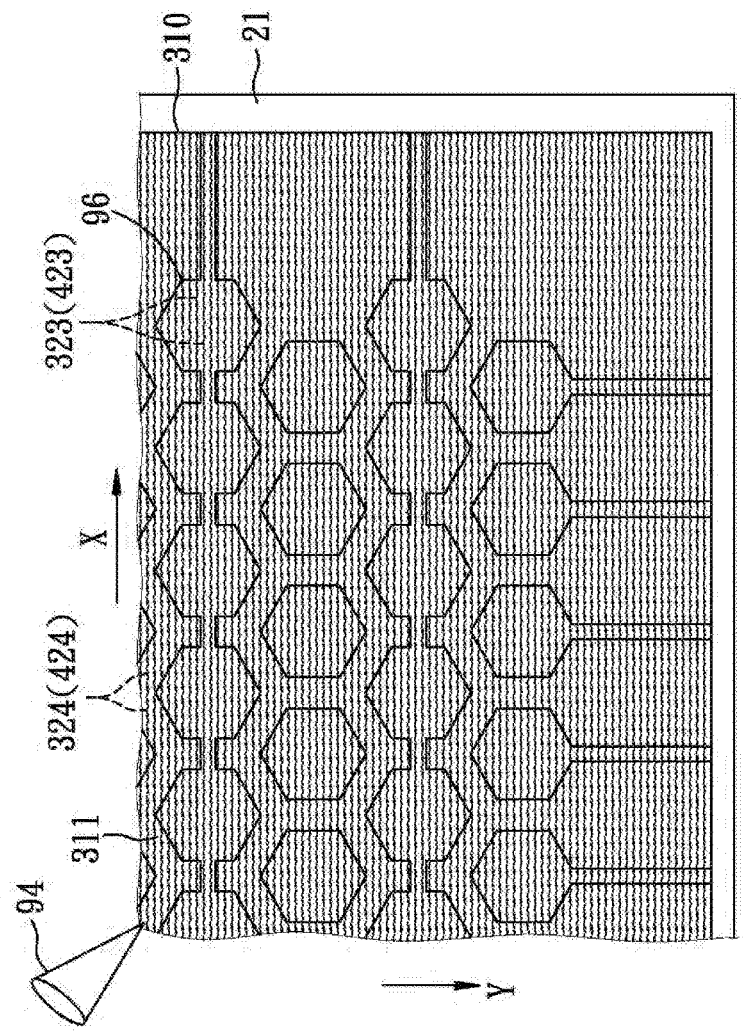
FIG. 13 is a fragmentary top schematic view of the second exemplary embodiment, illustrating Steps (d) and (e) of the method.

Referring to FIG. 13, Step (d) is to cure the first to-be-etched zones 311 of the lower transparent paste layer 310. Referring again to FIG. 13, Step (e) is to conduct laser ablation to the first to-be-etched zones 311 using the laser device 94, such that the non-transparent nano-conductors 323, 423, which are at the first-to-be-etched zones 311 and are partially exposed from the lower transparent paste layer 310, are gasified and that the first-to-be-etched zones 311 are formed with the nano-channels 324, 424, through which the gasified non-transparent nano-conductors 323, 423 are removed from the lower transparent paste layer 310.

Figure 14:
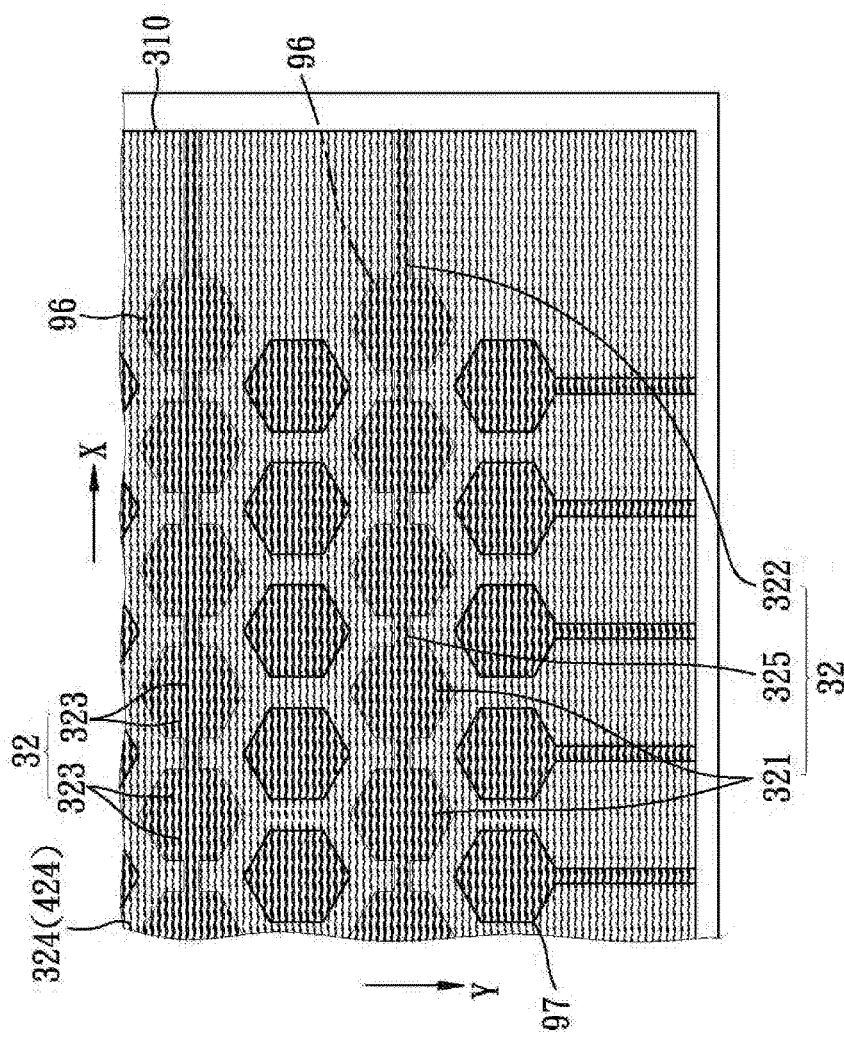
FIG. 14 is a fragmentary top schematic view of the second exemplary embodiment, illustrating a Step (f) of the method.

Referring to FIG. 14, Step (f) includes removing the first line patterns 96 of the mask layer 95, and curing the exposed parts of the lower transparent paste layer 310 corresponding to the first line patterns 96, so as to form the sensing segments 321, the outer terminal portions 322, and the connecting segments 325 of the first sensor lines 32 along the first direction (X).

Figure 15:
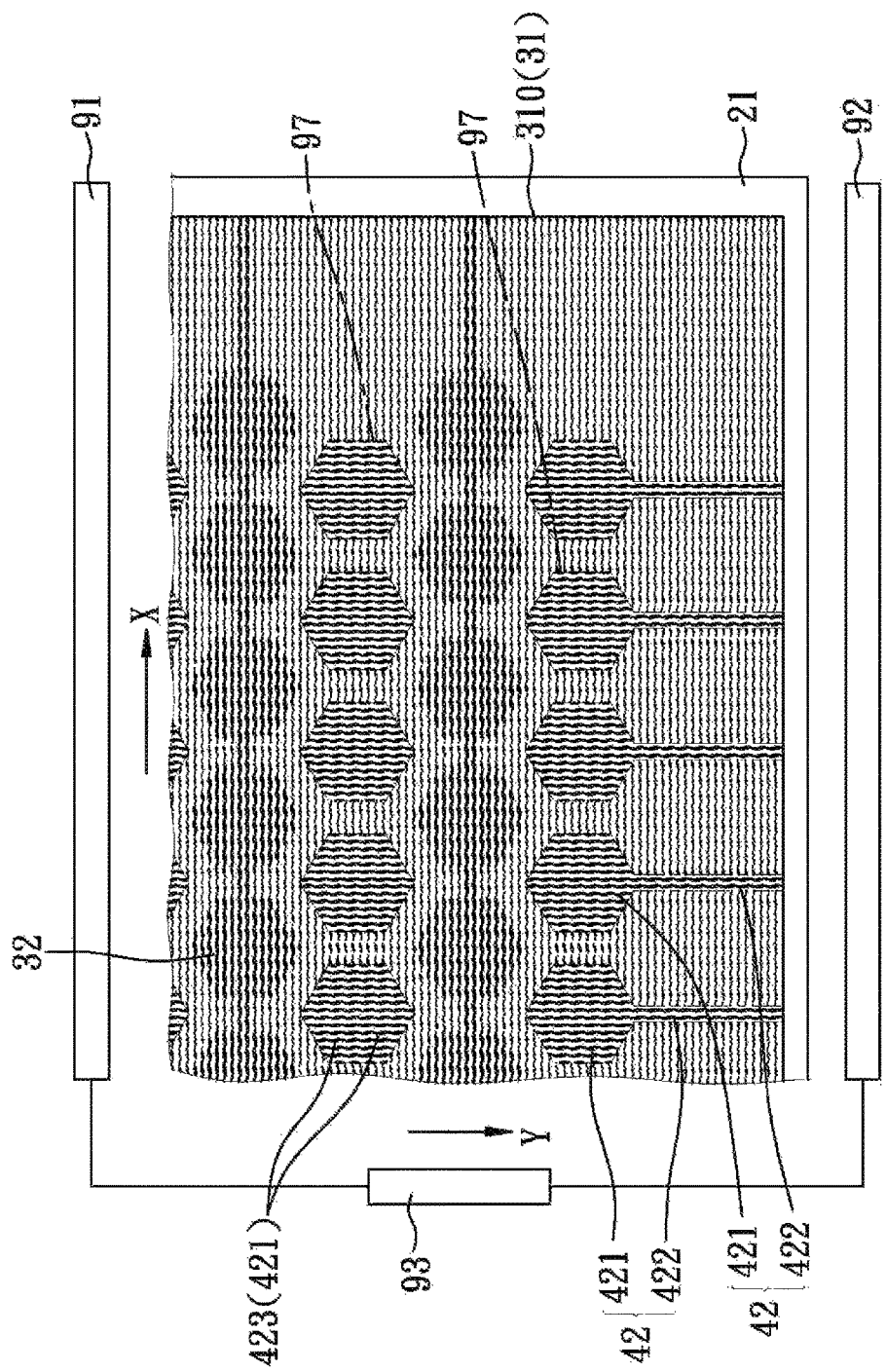
FIG. 15 is a fragmentary top schematic view of the second exemplary embodiment, illustrating Steps (g) and (h) of the method.

Referring to FIG. 15, Step (g) includes removing the second line patterns 97 and providing an electric field to the lower transparent electrically-conductive paste layer 30 using the electrode plates 91, 92 coupled electrically with the power supply 93, such that the non-transparent nano-conductors 423 remained in the lower transparent paste layer 310 are arranged into multiple row along the second direction (Y) in which the non-transparent nano-conductors 423 contact each other. Referring to FIG. 15 again, Step (h) includes curing remaining parts of the lower transparent paste layer 310 corresponding in position to the second line patterns 97, so as to form the lower transparent insulating layer 31, the sensing segments 421 and the outer terminal portions 422 of the second sensor lines 42.

Figure 16:
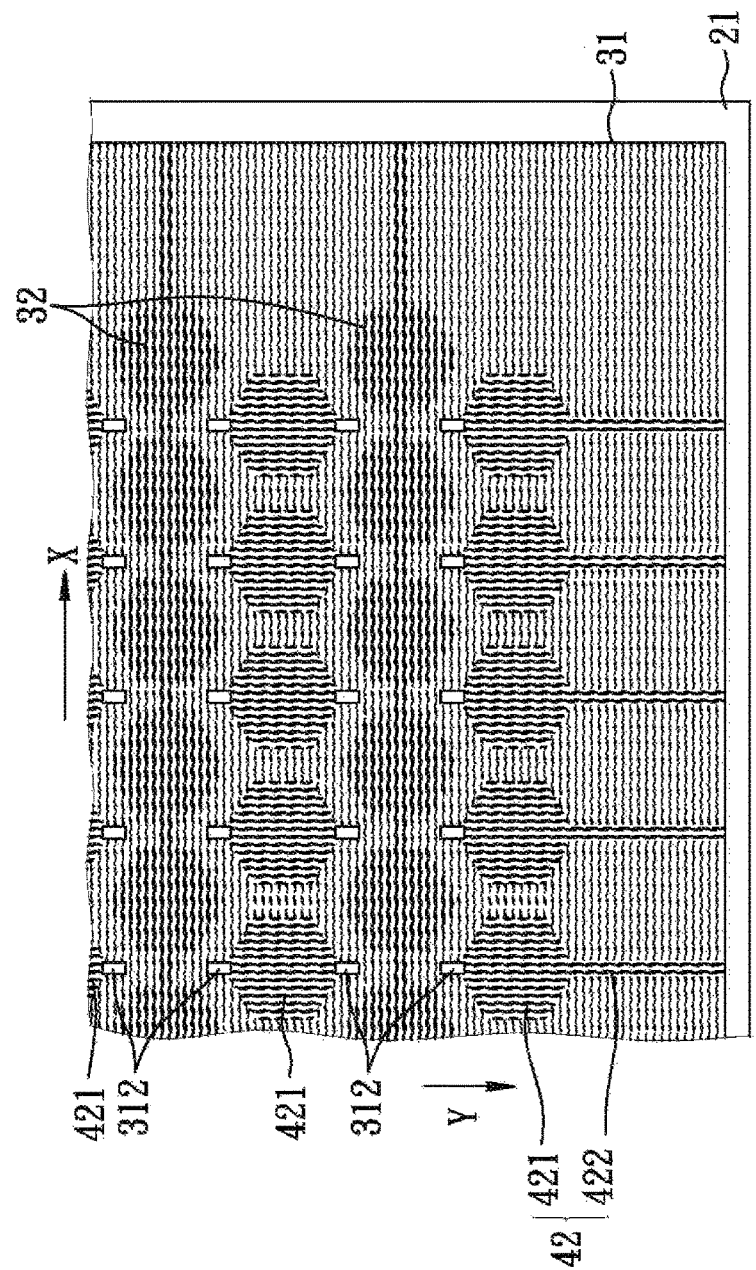
FIG. 16 is a fragmentary top schematic view of the second exemplary embodiment, illustrating a Step (i) of the method.

Referring to FIG. 16, Step (i) includes forming a pair of holes 312 respectively at adjacent sides of each adjacent pair of the sensing segments 421 in the second sensor lines 42 of the lower transparent insulating layer 31 along the second direction (Y). In this embodiment, Step (i) can be implemented using the conventional photolithography and dry etching processes. Since the feature of this disclosure does not reside in the hole-formation step, further details thereof are omitted herein.

Figure 17:
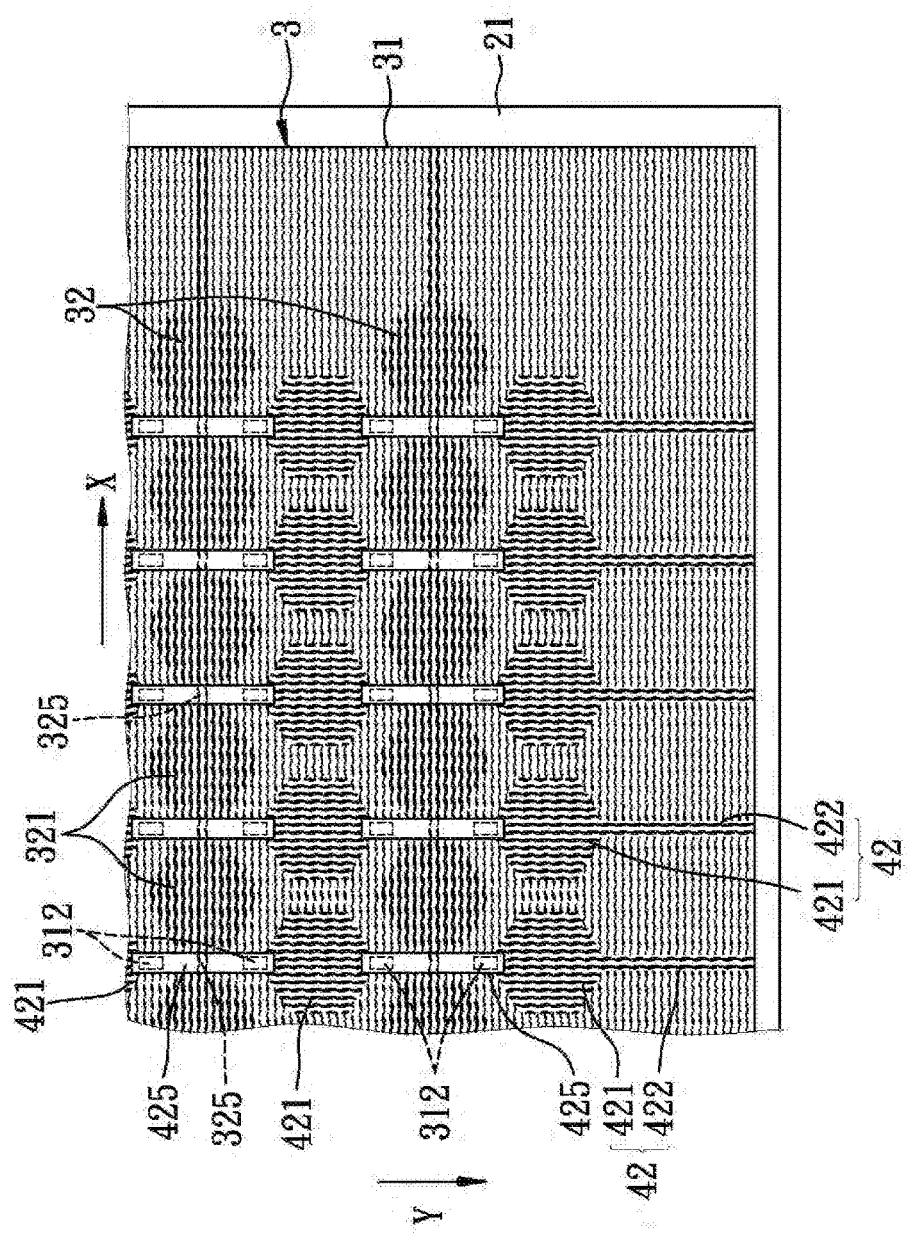
FIG. 17 is a fragmentary top schematic view of the second exemplary embodiment, illustrating a Step (j) of the method.

Referring to FIG. 17, Step (j) includes forming the connecting segments 425 of each of the second sensor lines 42 on the lower transparent insulating layer 31. The connecting segments 425 fill correspondingly the pairs of holes 312 and bridge the adjacent pairs of the sensing segments 421 of the second sensor lines 42 in such a manner that the connecting segments 425 of the second sensor lines 42 are disposed above and correspondingly across the connecting segments 325 of the first sensor lines 32 to form the lower patterned transparent electrically-conductive film 3.

Figure 18:
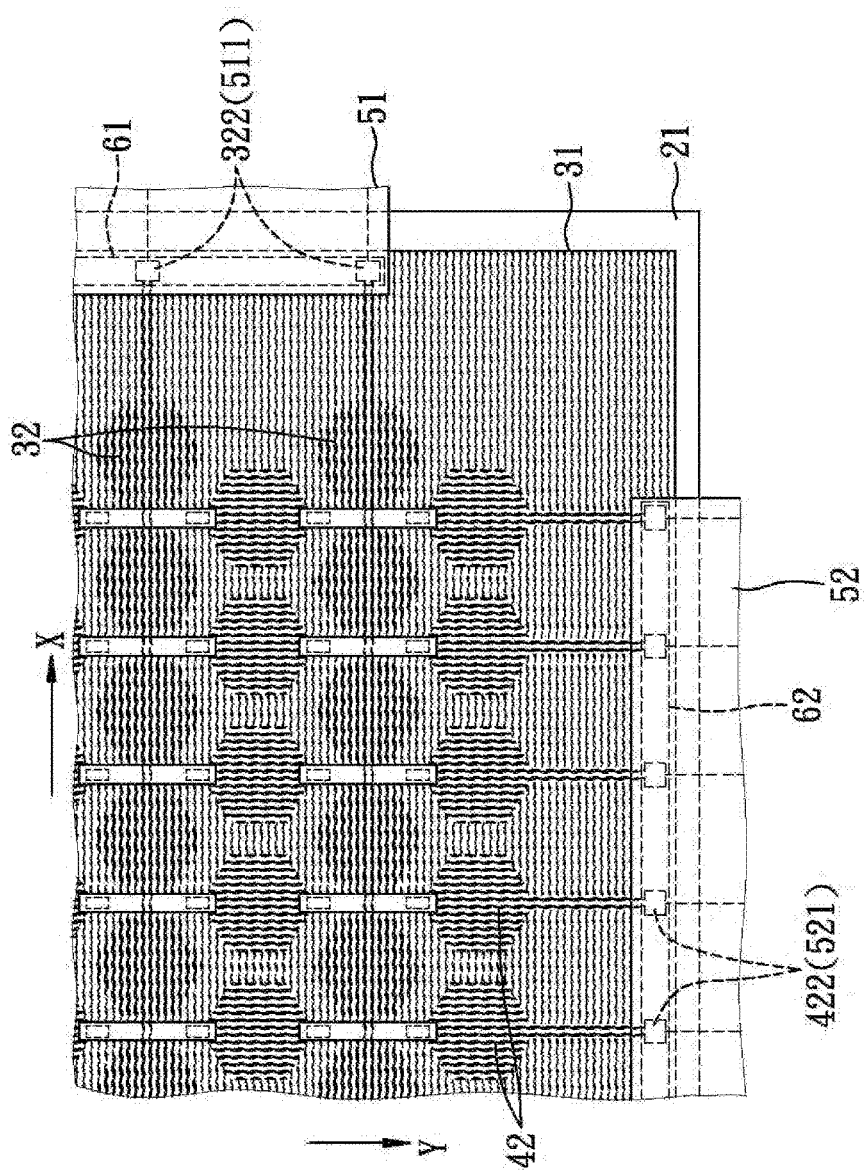
FIG. 18 is a fragmentary top schematic view of the second exemplary embodiment, illustrating a Step (k) of the method.

Referring to FIG. 18, Step (k) includes bonding the outer terminal portions 322 of the first sensor lines 32 in the lower transparent insulating layer 31 to the bonding pads 511 of the lower flexible printed circuit board 51 using the lower anisotropic electrically-conductive film 61, and bonding the outer terminal portions 422 of the second sensor lines 42 in the lower transparent insulating layer 31 to the bonding pads 521 of the upper flexible printed circuit board 52 using the upper anisotropic electrically-conductive film 62.

Referring back to FIGS. 8 and 9, Step (1) includes attaching the upper optical clear adhesive layer 82 onto and between the lower transparent insulating layer 31 and the transparent protective cover 7.

Figure 19:
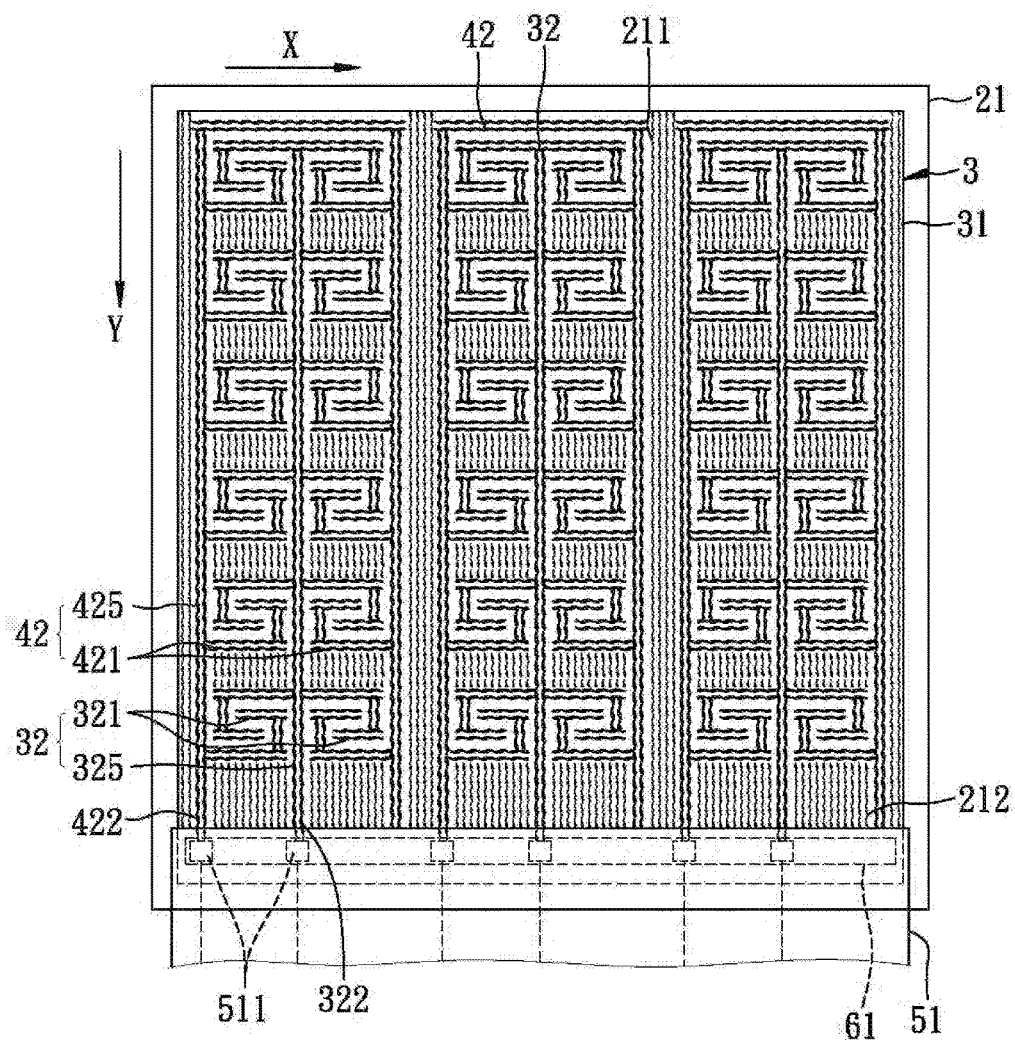
FIG. 19 is a fragmentary top schematic view of a third exemplary embodiment of the capacitive touch-sensitive device according to the present disclosure, illustrating a patterned transparent electrically-conductive film.

Referring to FIG. 19, a third exemplary embodiment of the capacitive touch-sensitive device according to the present disclosure is substantially identical to that of the second exemplary embodiment. The difference resides in that the third exemplary embodiment only includes the lower patterned transparent electrically-conductive film 3, the lower flexible circuit board 51 and the lower anisotropic electrically-conductive film 61, and that the detail structure of the lower patterned transparent electrically-conductive film 3 is different from that of the second exemplary embodiment. In this embodiment, the first sensor lines 32 of the lower patterned transparent electrically-conductive film 3 are disposed co-planarly within the second sensor lines 42 in the lower transparent insulating layer 31. The first and second sensor lines 32, 42 are mutually spaced apart along the first direction (X) and extend along the second direction (Y). The connecting segments 325 of each of the first sensor lines 32 extend along the second direction (Y) and the sensing segments 321 of each of the first sensor lines 32 are mutually spaced apart along the second direction (Y) and extend oppositely away from the connecting segment 325 in pairs. The connecting segments 425 of each of the second sensor lines 42 extend along the second direction (Y) to surround a corresponding one of the first sensor lines 32. The sensing segments 421 of each of the second sensor lines 42 are disposed to be mutually spaced apart along the second direction (Y) in pairs corresponding respectively to the pairs of the sensing segments 321 of the first sensor lines 32. In each pair of the sensing segments 421 of the second sensor lines 42, the sensing segments 421 extend from the corresponding connecting segment 425 respectively toward the sensing segments 321 of the first sensor lines 32 in a corresponding pair. The sensing segments 321, 421 and the connecting segments 325, 425 of the first and second sensor lines 32, 42 are disposed at the viewable zone 211 of the lower transparent substrate 21. The outer terminal portions 322, 422 of the first and second sensor lines 32, 42 are respectively connected to the connecting segments 325, 425 of the first and second sensor lines 32, 42 and are disposed at the trace zone 212 of the lower transparent substrate 21. The sensing segments 321 of each of the first sensor lines 32 and the sensing segments 421 of an adjacent one of the second sensor lines 42 are complementary in shape.

From the description of the above-mentioned exemplary embodiments, the first and second sensor lines 32, 42 of this disclosure are correspondingly disposed in the lower and upper transparent insulating layers 31, 41 having substantially identical refractive indexes, or are disposed simultaneously into the lower transparent insulating layer 31 having a uniform refractive index. Moreover, the first and second sensor lines 32, 42 are mutually electrically isolated via the lower and upper transparent insulating layers 31, 41. As such, when the capacitive touch-sensitive device of either one of these exemplary embodiments is incorporated with a flat panel display to become to a touch panel, source light emitted from the front panel display and into the lower and upper patterned transparent electrically-conductive films 3, 4 may not incur bright etched lines at the pattern boundaries of the lower and upper patterned transparent electrically-conductive films 3, 4, so that the displaying effect of the touch panel can be effectively enhanced, and that the aforementioned IM layer can be omitted to reduce the overall thickness of the touch-sensitive device.

It is worth noting that, in these exemplary embodiments, the non-transparent nano-conductors 323, 423 of the first and second sensor lines 32, 42 are silver nano-wires. The outer terminal portions 322, 422 of the first and second sensor lines 32, 42 may adopt the silver nano-wires to replace the conventional external transmission lines (i.e., the external transmission lines made of silver adhesives). Since, the silver nano-wires have a transparent visual effect to human vision, there is no need to adopt black matrix (BM) for blocking the conventional external transmission lines made of silver adhesives. Thus, the frame width of the capacitive touch-sensitive device can be effectively reduced. Moreover, the nano-scale channels 324, 424 in the lower and upper transparent insulating layers 31, 41 may form rough interfaces therein to effectively provide light scattering of the source light. Furthermore, the non-transparent nano-conductors 323, 423 of each of the first and second sensor lines 32, 42 are arranged using the electric field into multiple rows, in which the non-transparent nano-conductors 323, 423 contact each other along the line directions of the first and second sensor lines 32, 42, so that the electrical conductivity of the first and second sensor lines 32, 42 can be assured and that electrical stability of the capacitive touch-sensitive device can be improved.

To sum up, in the exemplary embodiments of the capacitive touch-sensitive device and the method of making the same according to the present disclosure, the first and second sensor lines 32, 42 are correspondingly disposed in the lower and upper transparent insulating layers 31, 41 having substantially identical refractive indexes, or are disposed simultaneously into the lower transparent insulating layer 31 having a uniform refractive index. Moreover, the first and second sensor lines 32, 42 are mutually electrically isolated via the lower and upper transparent insulating layers 31, 41. As such, bright etched lines of the lower and upper patterned transparent electrically-conductive films 3, 4 may not be incurred and the displaying effect of the touch panel can be effectively enhanced, and the aforementioned IM layer can be omitted so as to reduce the overall thickness and the production cost of the touch-sensitive device. In addition, there is no need to adopt black matrix (BM) and the conventional external transmission lines, so that the frame width of the capacitive touch-sensitive device can be effectively reduced. Moreover, the nano-scale channels 324, 424 in the lower and upper transparent insulating layers 31, 41 may effectively provide a light scattering effect. Furthermore, the non-transparent nano-conductors 323, 423 of each of the first and second sensor lines 32, 42 are arranged using the electric field into multiple rows, in which the non-transparent nano-conductors 323, 423 contact each other along the line directions of the first and second sensor lines 32, 42, so that electrical stability of the capacitive touch-sensitive device can be improved.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A capacitive touch-sensitive device, comprising:
   a transparent substrate unit; and
   at least one patterned transparent electrically-conductive film formed on said transparent substrate unit, wherein:
      said at least one patterned transparent electrically-conductive film comprises:
         a transparent insulating layer having a first side adjacent to said transparent substrate unit; and
         a plurality of mutually electrically isolated sensor lines and a plurality of nano-scale channels, spaced apart from said plurality of mutually electrically isolated sensor lines, that are disposed in said transparent insulating layer and between said first side and a second side of said transparent insulating layer opposite to said first side of said transparent insulating layer, each of said plurality of mutually electrically isolated sensor lines are substantially made of a plurality of non-transparent nano-conductors, and each of said plurality of nano-scale channels are formed by removing non-transparent nano-conductors.

2. The capacitive touch-sensitive device according to claim 1, wherein:

said plurality of non-transparent nano-conductors are configured as spheres, wires or discs.

3. The capacitive touch-sensitive device according to claim 1, wherein:

said plurality of non-transparent nano-conductors are silver nano-wires, and said transparent insulating layer is made of a polymer material.

4. The capacitive touch-sensitive device according to claim 1, wherein:

said plurality of non-transparent nano-conductors of each of said plurality of mutually electrically isolated sensor lines are substantially arranged along a line direction of said plurality of mutually electrically isolated sensor lines into multiple rows.

5. The capacitive touch-sensitive device according to claim 4, wherein:

said at least one patterned transparent electrically-conductive film comprises a lower patterned transparent electrically-conductive film and an upper patterned transparent electrically-conductive film, said transparent substrate unit comprises a lower transparent substrate and an upper transparent substrate that face each other, each of said lower transparent substrate and said upper transparent substrate has a viewable zone and a trace zone adjacent to said viewable zone, said lower patterned transparent electrically-conductive film has a lower transparent insulating layer formed on said lower transparent substrate, a first subset of said plurality of mutually electrically isolated sensor lines are disposed in said lower transparent insulating layer, said upper patterned transparent electrically-conductive film has an upper transparent insulating layer formed on said upper transparent substrate, a second subset of said plurality of mutually electrically isolated sensor lines are disposed in said upper transparent insulating layer, each of said first subset of said plurality of mutually electrically isolated sensor lines and said second subset of said plurality of mutually electrically isolated sensor lines has a plurality of mutually spaced apart sensing segments and an outer terminal portion, said line direction of said first subset of said plurality of mutually electrically isolated sensor lines extends along a first direction in such a manner that said plurality of mutually spaced apart sensing segments of said first subset of said plurality of mutually electrically isolated sensor lines are disposed at said viewable zone of said lower transparent substrate and in such a manner that said outer terminal portions of said first subset of said plurality of mutually electrically isolated sensor lines are disposed at said trace zone of said lower transparent substrate, said first subset of said plurality of mutually electrically isolated sensor lines are mutually spaced apart along a second direction that is substantially perpendicular to said first direction, said line direction of said second subset of said plurality of mutually electrically isolated sensor lines extends along said second direction and said second subset of said plurality of mutually electrically isolated sensor lines are mutually spaced apart along said first direction in such a manner that said plurality of mutually spaced apart sensing segments of said second subset of said plurality of mutually electrically isolated sensor lines are disposed at said viewable zone of said upper transparent substrate and in such a manner that said outer terminal portions of said second subset of said plurality of mutually electrically isolated sensor lines are disposed at said trace zone of said upper transparent substrate, and said plurality of mutually spaced apart sensing segments of said second subset of said plurality of mutually electrically isolated sensor lines are correspondingly disposed above and across said plurality of mutually spaced apart sensing segments of said first subset of said plurality of mutually electrically isolated sensor lines.

6. The capacitive touch-sensing device according to claim 4, wherein:

said at least one patterned transparent electrically-conductive film comprises a lower patterned transparent electrically-conductive film, said transparent substrate unit comprises a lower transparent substrate having a viewable zone and a trace zone adjacent to said viewable zone, said lower patterned transparent electrically-conductive film has a lower transparent insulating layer formed on said lower transparent substrate, a first subset of said plurality of mutually electrically isolated sensor lines and a second subset of said plurality of mutually electrically isolated sensor lines are substantially disposed in said lower transparent insulating layer, said lower transparent insulating layer is formed with multiple pairs of holes, each of said first subset of said plurality of mutually electrically isolated sensor lines and said second subset of said plurality of mutually electrically isolated sensor lines has a plurality of mutually spaced apart sensing segments, a plurality of connecting segments interconnecting correspondingly adjacent pairs of said plurality of mutually spaced apart sensing segments, and an outer terminal portion, an axial direction of said first subset of said plurality of mutually electrically isolated sensor lines extends along a first direction in such a manner that said plurality of mutually spaced apart sensing segments of said first subset of said plurality of mutually electrically isolated sensor lines are disposed at said viewable zone of said lower transparent substrate and in such a manner that said outer terminal portions of said first subset of said plurality of mutually electrically isolated sensor lines are disposed at said trace zone of said lower transparent substrate, said first subset of said plurality of mutually electrically isolated sensor lines are mutually spaced apart along a second direction that is substantially perpendicular to said first direction, an axial direction of said second subset of said plurality of mutually electrically isolated sensor lines extends along said second direction and said second subset of said plurality of mutually electrically isolated sensor lines are mutually spaced apart along said first direction in such a manner that said plurality of mutually spaced apart sensing segments of said second subset of said plurality of mutually electrically isolated sensor lines are disposed at said viewable zone of said lower transparent substrate and in a manner such that said outer terminal portions of said second subset of said plurality of mutually electrically isolated sensor lines are disposed at said trace zone of said lower transparent substrate, each pair of said holes corresponds respectively to adjacent sides in an adjacent pair of said plurality of mutually spaced apart sensing segments of said second subset of said plurality of mutually electrically isolated sensor lines along said second direction, and each of said plurality of connecting segments of said second subset of said plurality of mutually electrically isolated sensor lines being formed on said lower transparent insulating layer and filling a corresponding pair of said holes to bridge a corresponding adjacent pair of said plurality of mutually spaced apart sensing segments of said second subset of said plurality of mutually electrically isolated sensor lines and cross over a corresponding one of said plurality of connecting segments of said first subset of said plurality of mutually electrically isolated sensor lines.

7. The capacitive touch-sensitive device according to claim 4, wherein:

said at least one patterned transparent electrically-conductive film comprises a lower patterned transparent electrically-conductive film, said transparent substrate unit comprises a lower transparent substrate having a viewable zone and a trace zone adjacent to said viewable zone, said lower patterned transparent electrically-conductive film has a lower transparent insulating layer formed on said lower transparent substrate, a first subset of said plurality of mutually electrically isolated sensor lines, and a second subset of said plurality of mutually electrically isolated sensor lines, said first subset of said plurality of mutually electrically isolated sensor lines and said second subset of said plurality of mutually electrically isolated sensor lines are substantially and coplanarly disposed in said lower transparent insulating layer, said first subset of said plurality of mutually electrically isolated sensor lines and second subset of said plurality of mutually electrically isolated sensor lines are mutually spaced apart along a first direction and extend along a second direction substantially perpendicular to said first direction, each of said first subset of said plurality of mutually electrically isolated sensor lines and said second subset of said plurality of mutually electrically isolated sensor lines has a plurality of sensing segments that are mutually spaced apart along said second direction, a connecting segment extending along said second direction to interconnect said plurality of mutually spaced apart sensing segments, and an outer terminal portion connected to said connecting segment, said plurality of mutually spaced apart sensing segments and said connecting segments of said first subset of said plurality of mutually electrically isolated sensor lines and said second subset of said plurality of mutually electrically isolated sensor lines are disposed at said viewable zone of said lower transparent substrate, said outer terminal portions of said first subset of said plurality of mutually electrically isolated sensor lines and said second subset of said plurality of mutually electrically isolated sensor lines are disposed at said trace zone of said lower transparent substrate, and said plurality of mutually spaced apart sensing segments of each of said first subset of said plurality of mutually electrically isolated sensor lines and said plurality of mutually spaced apart sensing segments of an adjacent one of said second subset of said plurality of mutually electrically isolated sensor lines are complementary in shape.

8. The capacitive touch-sensitive device according to claim 1, wherein said plurality of nano-scale channels are devoid of material.

9. The capacitive touch-sensitive device according to claim 1, wherein said plurality of mutually electrically isolated sensor lines are connected to a second side of said transparent insulating layer.

10. A capacitive touch-sensitive device, comprising:

a transparent substrate unit; and at least one patterned transparent electrically-conductive film formed on said transparent substrate unit wherein:

said at least one patterned transparent electrically-conductive film comprises:

a transparent insulating layer having a first side adjacent to said transparent substrate unit; and a plurality of mutually electrically isolated sensor lines and a plurality of nano-scale channels, spaced apart from said plurality of mutually electrically isolated sensor lines, that are disposed in said transparent insulating layer and between said first side and a second side of said transparent insulating layer opposite to said first side of said transparent insulating layer, each of said plurality of mutually electrically isolated sensor lines are substantially made of a plurality of non-transparent nano-conductors, a first sensor line of said plurality of mutually electrically isolated sensor lines comprises a first plurality of sensing segments each comprising a first subset of said plurality of non-transparent nano-conductors extending in a first direction, a second sensor line of said plurality of mutually electrically isolated sensor lines comprises a second plurality of sensing segments each comprising a second subset of said plurality of non-transparent nano-conductors extending in a second direction different than said first direction, and each of said plurality of nano-scale channels are formed by removing non-transparent nano-conductors.

11. The capacitive touch-sensitive device according to claim 10, wherein said plurality of mutually electrically isolated sensor lines are connected to a second side of said transparent insulating layer.

12. The capacitive touch-sensitive device according to claim 10, wherein said transparent insulating layer is made of a polymer material.

* * * * *